United States Patent
Yamada

(10) Patent No.: US 12,396,167 B2
(45) Date of Patent: Aug. 19, 2025

(54) SEMICONDUCTOR STORAGE DEVICE

(71) Applicant: Socionext Inc., Kanagawa (JP)

(72) Inventor: Tomoyuki Yamada, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 445 days.

(21) Appl. No.: 18/109,086

(22) Filed: Feb. 13, 2023

(65) Prior Publication Data

US 2023/0262970 A1   Aug. 17, 2023

(30) Foreign Application Priority Data

Feb. 16, 2022   (JP) ................................ 2022-022240

(51) Int. Cl.
H10B 20/25   (2023.01)
H10B 20/00   (2023.01)

(52) U.S. Cl.
CPC ........... H10B 20/25 (2023.02); H10B 20/387 (2023.02)

(58) Field of Classification Search
CPC ....... H10B 20/25; H10B 20/387; H10B 20/34
USPC .................................................. 365/63, 205
See application file for complete search history.

(56) References Cited

U.S. PATENT DOCUMENTS

| | | | |
|---|---|---|---|
| 7,402,855 B2 | 7/2008 | Kurjanowicz | |
| 2021/0074350 A1* | 3/2021 | Vincent | H10B 10/12 |
| 2021/0217454 A1* | 7/2021 | Ocker | H10B 53/30 |
| 2021/0375340 A1* | 12/2021 | Young | G11C 7/12 |
| 2022/0013532 A1* | 1/2022 | Young | G11C 16/08 |
| 2022/0285435 A1* | 9/2022 | Lee | H10N 50/10 |
| 2022/0302121 A1* | 9/2022 | Gutwin | G11C 11/404 |
| 2022/0352073 A1* | 11/2022 | Peng | H01L 23/53228 |
| 2022/0359536 A1* | 11/2022 | Yang | H10D 84/038 |
| 2022/0359569 A1* | 11/2022 | Wang | H01L 23/5226 |
| 2022/0367474 A1* | 11/2022 | Sakui | G11C 11/4091 |
| 2022/0376114 A1* | 11/2022 | Müller | H10D 30/701 |
| 2022/0384446 A1* | 12/2022 | Harada | H10B 12/33 |
| 2022/0415786 A1* | 12/2022 | Cheng | H01L 21/76849 |

OTHER PUBLICATIONS

P. Weckx et al., "Stacked nanosheet fork architecture for SRAM design and device co-optimization toward 3 nm", 2017 IEEE International Electron Devices Meeting (IEDM), Dec. 5, 2017, pp. 505-508.
P. Weckx et al., "Novel forksheet device architecture as ultimate logic scaling device towards 2nm", 2019 IEEE International Electron Devices Meeting (IEDM), Dec. 11, 2019, pp. 871-874.

* cited by examiner

*Primary Examiner* — Michael T Tran
(74) *Attorney, Agent, or Firm* — Rimon P.C.

(57) ABSTRACT

A semiconductor storage device includes first and second memory cells adjacent to each other in the X direction, each of the memory cells having a program transistor and a switch transistor. First and second nanosheets, which are to be channel regions of the program transistors, are exposed from first and second gate interconnects, respectively, at faces on the sides opposed to each other in the X direction. Third and fourth nanosheets, which are to be channel regions of the switch transistors, are exposed from third and fourth gate interconnects, respectively, at faces on the sides opposed to each other in the X direction.

6 Claims, 11 Drawing Sheets

OTP

MASK ROM

SEMICONDUCTOR STORAGE DEVICE

CROSS-REFERENCE TO RELATED APPLICATIONS

This application claims priority to Japanese Patent Application No. 2022-022240 filed on Feb. 16, 2022, the entire disclosure of which is incorporated by reference herein.

BACKGROUND

The present disclosure relates to a semiconductor storage device provided with nanosheet field effect transistors (FETs), and more particularly to a layout structure of nonvolatile memory cells using nanosheet FETs.

Semiconductor storage devices provided with nonvolatile memory cells are used in many applications. As one type of nonvolatile memory cells, there is a one-time programmable (OTP) memory cell, which is characterized in storing a state of "1" or "0" in the memory by breakdown of an insulating film or other means and reading the stored state.

U.S. Pat. No. 7,402,855 discloses a configuration of an OTP memory. In this configuration, one transistor has a gate oxide film having two portions different in thickness, and by breaking the thinner portion of the gate oxide film, a state of "1" or "0" is stored in the memory.

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied. As one type of such three-dimensional transistors, nanosheet (nanowire) FETs have received attention.

P. Weckx et al., "Stacked nanosheet fork architecture for SRAM design and device co-optimization toward 3 nm," 2017 IEEE International Electron Devices Meeting (IEDM), December 2017, IEDM17-505-508 (Document 1) and P. Weckx et al., "Novel forksheet device architecture as ultimate logic scaling device towards 2 nm," 2019 IEEE International Electron Devices Meeting (IEDM), December 2019, IEDM19-871-874 (Document 2) disclose layouts of SRAM cells using a nanosheet FET having a gate electrode shaped like a fork.

Note that the nanosheet FET having a fork-shaped gate electrode is hereinafter called a forksheet FET following the cited Document 1.

Thus far, no examination has been made on the layout structure of an OTP memory using forksheet FETs.

An objective of the present disclosure is providing a layout structure of a small-area OTP memory using forksheet FETs.

SUMMARY

According to the first mode of the present disclosure, a semiconductor storage device including first and second memory cells adjacent to each other in a first direction, the first and second memory cells being nonvolatile, includes: first and second word lines extending in the first direction; and first and second bit lines extending in a second direction perpendicular to the first direction, wherein the first memory cell includes a first program transistor with a gate connected to the first word line, and a first switch transistor, provided between the first program transistor and the first bit line, with a gate connected to the second word line, the second memory cell includes a second program transistor with a gate connected to the first word line, and a second switch transistor, provided between the second program transistor and the second bit line, with a gate connected to the second word line, the first and second program transistors are nanosheet field effect transistors (FETs) having first and second nanosheets, respectively, as channel regions, the first and second switch transistors are nanosheet FETs having third and fourth nanosheets, respectively, as channel regions, the first word line includes a first gate interconnect surrounding peripheries of the first nanosheet in the first direction and a third direction perpendicular to the first and second directions and a second gate interconnect surrounding peripheries of the second nanosheet in the first direction and the third direction, the second word line includes a third gate interconnect surrounding peripheries of the third nanosheet in the first direction and the third direction and a fourth gate interconnect surrounding peripheries of the fourth nanosheet in the first direction and the third direction, the first and second nanosheets are opposed to each other in the first direction, a face of the first nanosheet on a side closer to the second nanosheet in the first direction is exposed from the first gate interconnect, and a face of the second nanosheet on a side closer to the first nanosheet in the first direction is exposed from the second gate interconnect, and the third and fourth nanosheets are opposed to each other in the first direction, a face of the third nanosheet on a side closer to the fourth nanosheet in the first direction is exposed from the third gate interconnect, and a face of the fourth nanosheet on a side closer to the third nanosheet in the first direction is exposed from the fourth gate interconnect.

According to the above mode, the semiconductor storage device includes first and second nonvolatile memory cells adjacent to each other in the first direction. The first memory cell includes a first program transistor with a gate connected to the first word line, and a first switch transistor, provided between the first program transistor and the first bit line, with a gate connected to the second word line. The second memory cell includes a second program transistor with a gate connected to the first word line, and a second switch transistor, provided between the second program transistor and the second bit line, with a gate connected to the second word line. The first and second program transistors are nanosheet FETs having first and second nanosheets, respectively, as channel regions, and the first and second switch transistors are nanosheet FETs having third and fourth nanosheets, respectively, as channel regions. Faces of the first and second nanosheets on the sides opposed to each other are exposed from their corresponding gate interconnects, and faces of the third and fourth nanosheets on the sides opposed to each other are exposed from their corresponding gate interconnects. This can reduce the distance between the first nanosheet and the second nanosheet, and reduce the distance between the third nanosheet and the fourth nanosheet, thereby permitting area reduction of the semiconductor storage device.

According to the present disclosure, a layout structure of a small-area OTP memory using forksheet FETs can be provided.

BRIEF DESCRIPTION OF THE DRAWINGS

FIG. 9A shows an OTP memory cell and FIG. 9B shows a mask ROM cell.

FIG. 12A is a plan view and FIG. 12B is a cross-sectional view.

DETAILED DESCRIPTION

Embodiments of the present disclosure will be described hereinafter with reference to the accompanying drawings. In the following embodiments, it is assumed that the semiconductor storage device includes nanosheet field effect transistors (FETs). The nanosheet FET is a FET using a thin sheet (nanosheet) through which a current flows. Such a nanosheet is formed of silicon, for example. In the semiconductor storage device, it is assumed that some of the nanosheet FETs are forksheet FETs having a fork-shaped gate electrode. In the present disclosure, also, a semiconductor layer portion formed on each end of a nanosheet to constitute a terminal that is to be the source or drain of a nanosheet FET is called a "pad."

First, the basic structure of a forksheet FET will be described.

Figure 12A:
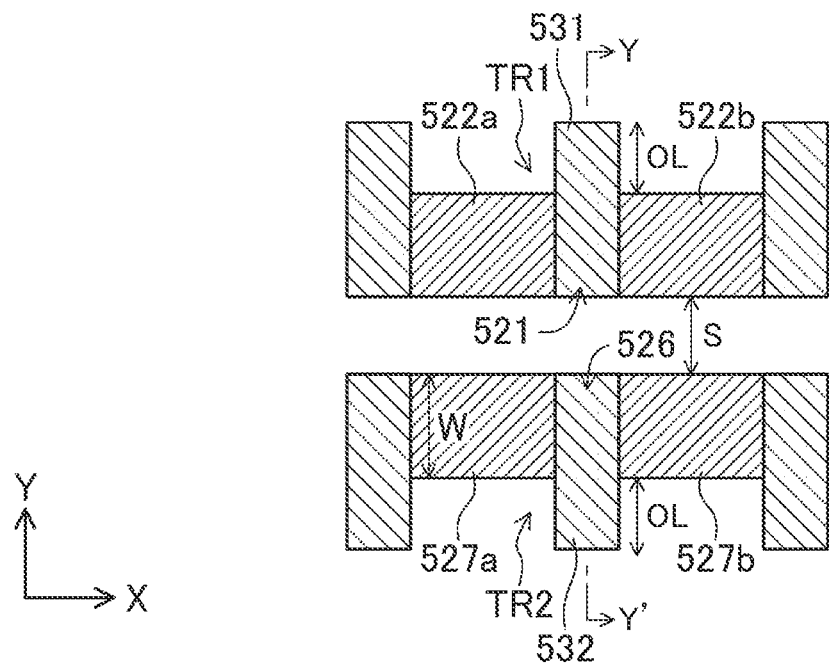
FIGS. 12A-12B are views showing a basic structure of a forksheet FET, where
Figure 12B:
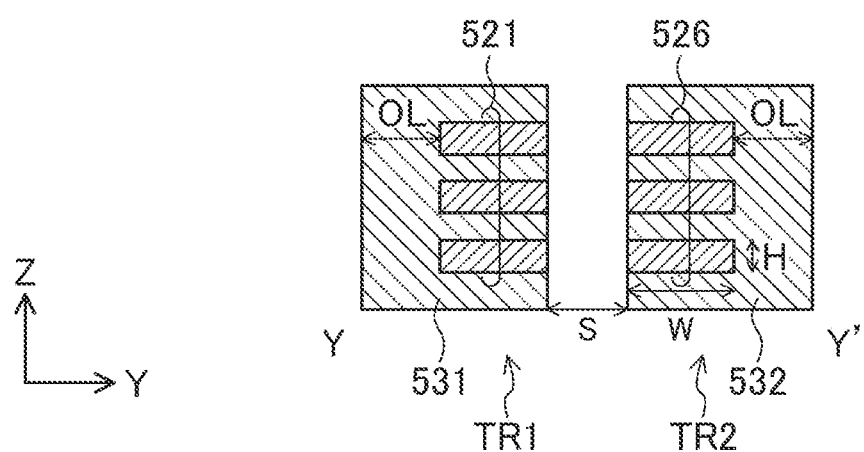
Figure 12B:
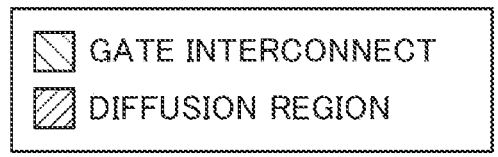

FIGS. 12A-12B are views showing the basic structure of a forksheet FET, where FIG. 12A is a plan view and FIG. 12B is a cross-sectional view taken along line Y-Y' in FIG. 12A. In the basic structure of FIGS. 12A-12B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 12A-12B, the channel portions 521 and 526 are each constituted by a stacked structure of three nanosheets overlapping one another as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via gate insulating films (not shown). Note however that the faces of the nanosheets constituting the channel portion 521 on the side closer to the transistor TR2 in the Y direction are exposed from the gate interconnect 531, not covered with the gate interconnect 531. That is, in the cross-sectional view of FIG. 12B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via gate insulating films (not shown). Note however that the faces of the nanosheets constituting the channel portion 526 on the side closer to the transistor TR1 in the Y direction are exposed from the gate interconnect 532, not covered with the gate interconnect 532. That is, in the cross-sectional view of FIG. 12B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 12A-12B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 12B, it is not limited to this. For example, the shape may be square, circular, or oval.

The semiconductor storage device may include both forksheet FETs and nanosheet FETs where the entire peripheries of nanosheets are surrounded by a gate interconnect, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations.

The source region and drain region of a transistor are herein called the "nodes" of the transistor as appropriate. That is, one node of a transistor refers to the source or drain of the transistor, and both nodes of a transistor refer to the source and drain of the transistor.

First Embodiment

Figure 1:
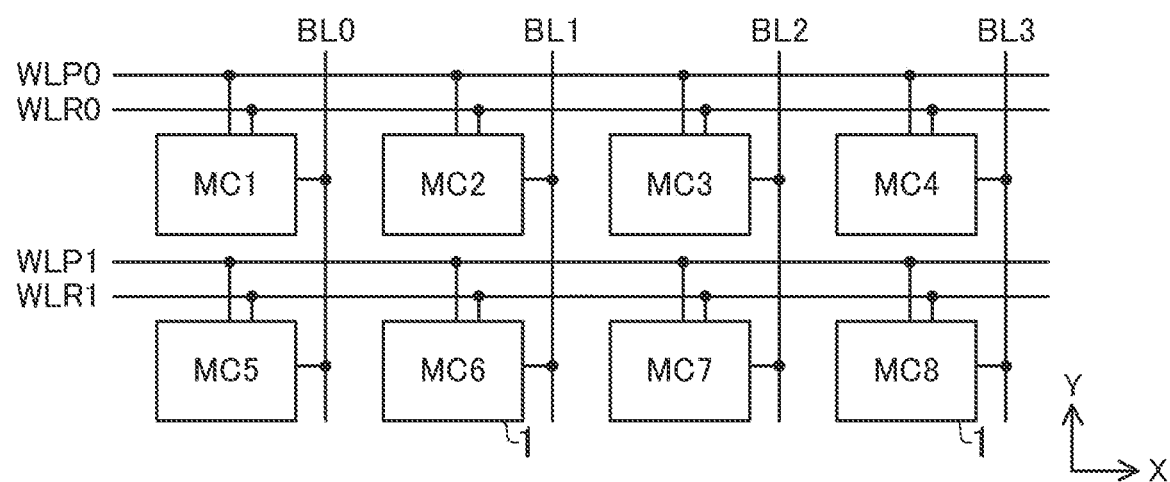
FIG. 1 shows a configuration example of a memory cell array of a semiconductor storage device according to the first embodiment.
Figure 2:
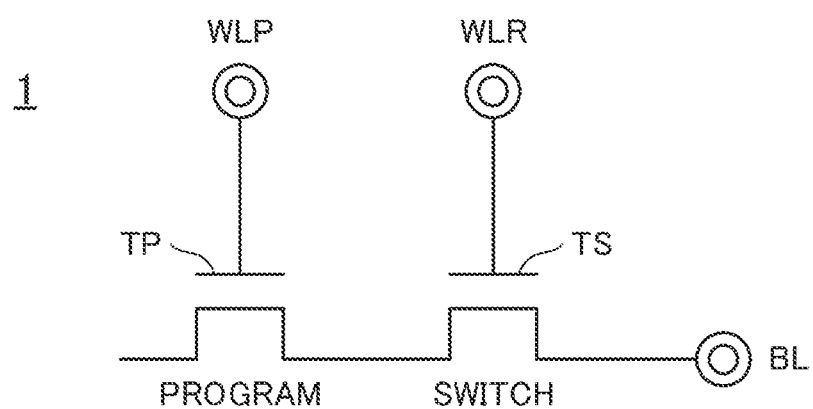
FIG. 2 is a circuit diagram of an OTP memory cell.

FIGS. 1 and 2 are views showing a configuration example of a semiconductor storage device provided with nonvolatile memory cells according to the first embodiment, where FIG. 1 is a block diagram of a memory cell array and FIG. 2 is a circuit diagram of a memory cell. As shown in FIG. 1, each memory cell 1 is connected with its corresponding first word line WLP (indicated as WLPi (i is an integer) as appropriate), second word line WLR (indicated as WLRi (i is an integer) as appropriate), and bit line BL (indicated as BLi (i is an integer) as appropriate). Note that, although the semiconductor storage device is provided with, not only the memory cell array, but also peripheral circuits such as a write circuit and a read circuit, illustration of such circuits is omitted here. Note also that, although the memory cell array includes (4×2) memory cells 1 (MC1 to MC8) in FIG. 1 for simplification of the illustration, the numbers of memory cells 1 in an X direction (direction in which the first and second word lines WLP and WLR extend in this embodiment) and in a Y direction (direction in which the bit lines BL extend in this embodiment) are not limited to these.

In this embodiment, the memory cells 1 are one-time programmable (OTP) memory cells of a gate oxide film breakdown type. As shown in FIG. 2, each memory cell 1 includes serially-connected n-type transistors TP and TS. The transistor TP is a program element (program transistor), of which the gate is connected to the first word line WLP. The program element stores a value "1"/"0" depending on the breakdown/non-breakdown state of the gate oxide film. The transistor TS is a switch element (switch transistor), of which the gate is connected to the second word line WLR. The switch element controls the access from the bit line BL to the program element. Here, the switch element and the program element are each constituted by a transistor having a gate oxide film thickness of the same level as that of a core transistor in an internal circuit of a semiconductor integrated circuit, for example.

The write operation of the memory cell 1 is performed in the following manner A high voltage VPP that is to be a write voltage is applied to a desired first word line WLP. The high voltage VPP is a voltage higher than the withstand voltage of the gate oxide film of the program element, which is 3 V, for example. Also, a voltage VPR is applied to the second word line WLR. The voltage VPR is a voltage lower than the withstand voltage of the gate oxide film of the switch element and also a voltage set so that the voltage (VPP−VPR) be also lower than the withstand voltage of the gate oxide film of the switch element, which is 1 V, for example. Also, 0 V is given to a bit line BL connected to a memory cell 1 in which breakdown of the gate oxide film is intended, and the voltage VPR is applied to a bit line BL connected to a memory cell 1 in which no breakdown of the gate oxide film is intended. As a result, in the memory cell 1 connected to the bit line BL to which 0 V has been given, the switch element becomes conductive and the gate oxide film of the program element is broken under the application of the high voltage VPP.

The read operation of the memory cell 1 is performed in the following manner. The bit line BL is precharged to 0 V, for example. A voltage VRR lower than the high voltage VPP is applied to desired first and second word lines WLP and WLR. The voltage VRR is a voltage causing no breakdown of the gate oxide film of the program element, which is 1 V, for example. At this time, when the gate oxide film of the program element has been broken, a current flows from the first word line WLP to the bit line BL through the gate of the program element, causing a rise in the potential of the bit line BL. On the other hand, when the gate oxide film of the program element has not been broken, the potential of the bit line BL remains unchanged. From this difference in potential, the state of the memory cell 1, i.e., a value "0" or "1" is read.

Figure 3:
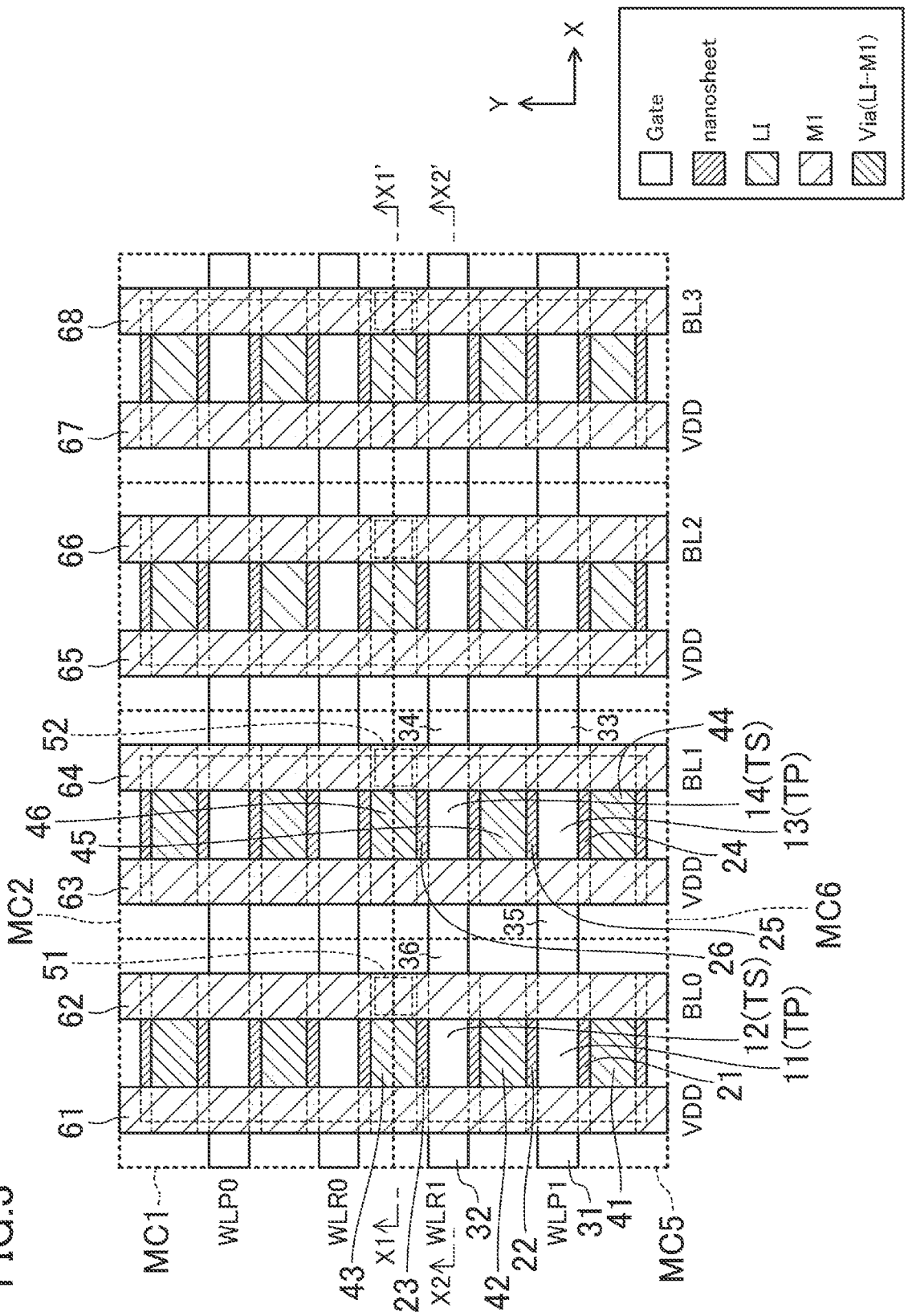
FIG. 3 is a plan view showing a layout structure example of memory cells according to the first embodiment.
Figure 4A:
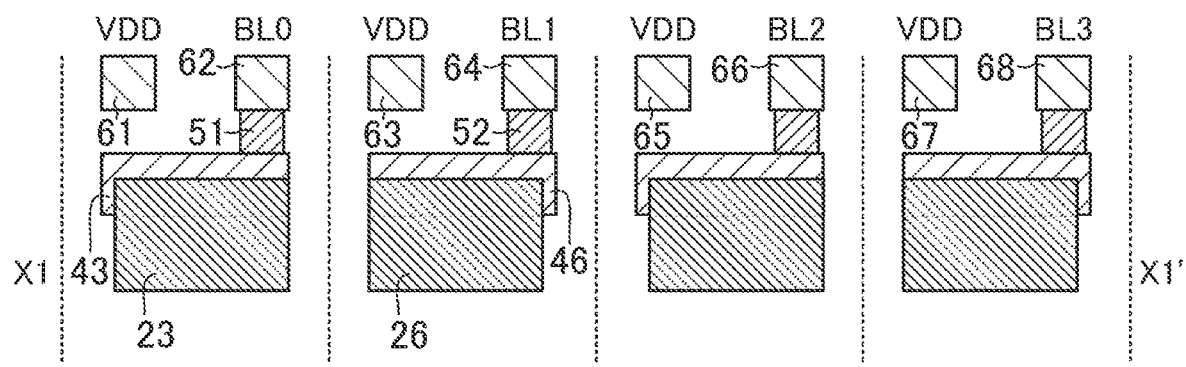
FIGS. 4A-4B are cross-sectional views of FIG. 3.
Figure 4B:
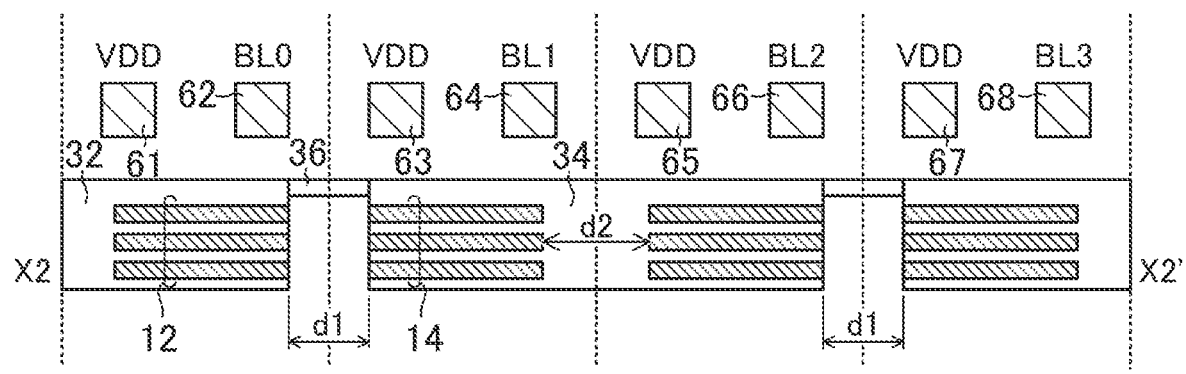
Figure 4B:
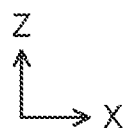

FIGS. 3 and 4A-4B are views showing an example of the layout structure of the memory cells according to the first embodiment. Specifically, FIG. 3 is a plan view of the memory cell array, and FIGS. 4A-4B are cross-sectional views of the memory cell array of FIG. 3 taken horizontally as viewed in plan, where FIG. 4A shows a cross section taken along line X1-X1' and FIG. 4B shows a cross section taken along line X2-X2'.

In the following description, in the plan views such as FIG. 3, the horizontal direction in the figure is called an X direction (corresponding to the first direction), the vertical direction in the figure is called a Y direction (corresponding to the second direction), and the direction perpendicular to the substrate plane is called a Z direction (corresponding to the depth direction). Note that the X direction is the direction in which gate interconnects and word lines extend, and the Y direction, which is the channel direction, is the direction in which bit lines extend.

FIG. 3 corresponds to the layout of (4×2) bits, and the dotted lines define the bounds of a memory cell of each bit. That is, FIG. 3 shows a configuration of an array of memory cells, four arranged in the X direction and two in the Y direction. The memory cells are inverted in the Y direction every other row in the Y direction. In FIG. 3, the leftmost memory cell and the second leftmost memory cell in the upper row correspond to the memory cells MC1 and MC2, respectively, in the block diagram of FIG. 1, and the leftmost memory cell and the second leftmost memory cell in the lower row correspond to the memory cells MC5 and MC6, respectively, in the block diagram of FIG. 1. Hereinafter, the structure of the memory cells will be described taking the memory cells MC5 and MC6 mainly as an example.

As shown in FIG. 3, interconnects 61 to 68 extending in the Y direction are formed in an M1 interconnect layer. The M1 interconnects 62, 64, 66, and 68 correspond to bit lines BL0, BL1, BL2, and BL3, respectively, and the M1 interconnects 61, 63, 65, and 67 are power supply lines supplying VDD.

The memory cell MC5 has nanosheets 11 and 12, each composed of three sheets, as the channel portions of the transistors TP and TS, respectively. The memory cell MC6 has nanosheets 13 and 14, each composed of three sheets, as the channel portions of the transistors TP and TS, respectively. That is, the memory cells MC5 and MC6 each include nanosheet FETs as the transistors TP and TS.

In FIG. 3, on the lower sides of the nanosheets 11 and 13 in the figure, pads 21 and 24 are formed respectively, each of which is a semiconductor layer of integral structure connected to the three sheets. On the upper sides of the nanosheets 11 and 13 and on the lower sides of the nanosheets 12 and 14 in the figure, pads 22 and 25 are formed respectively, each of which is a semiconductor layer of integral structure connected to the three sheets. On the upper sides of the nanosheets 12 and 14 in the figure, pads 23 and 26 are formed respectively, each of which is a semiconductor layer of integral structure connected to the three sheets.

The pads 21 and 24 are to be nodes of the transistors TP of the memory cells MC5 and MC6, respectively. The pads 22 and 25 are to be common nodes of the transistors TP and TS of the memory cells MC5 and MC6, respectively. The pads 23 and 26 are to be the other nodes of the transistors TS of the memory cells MC5 and MC6, respectively. Note that the pads 23 and 26 are shared with the memory cells MC1 and MC2, respectively, as nodes of the transistors TS thereof.

Gate interconnects 31, 32, 33, and 34 extending in the X direction are formed. The gate interconnect 31 surrounds the peripheries of the nanosheets 11 of the memory cell MC5 in the X and Z directions via gate insulating films (not shown). The gate interconnect 31 is to be the gate of the transistor TP of the memory cell MC5. The gate interconnect 32 surrounds the peripheries of the nanosheets 12 of the memory cell MC5 in the X and Z directions via gate insulating films (not shown). The gate interconnect 32 is to be the gate of the transistor TS of the memory cell MC5. The gate interconnect 33 surrounds the peripheries of the nanosheets 13 of the memory cell MC6 in the X and Z directions via gate insulating films (not shown). The gate interconnect 33 is to be the gate of the transistor TP of the memory cell MC6. The gate interconnect 34 surrounds the peripheries of the nanosheets 14 of the memory cell MC6 in the X and Z directions via gate insulating films (not shown). The gate interconnect 34 is to be the gate of the transistor TS of the memory cell MC6.

The gate interconnects 31 and 33 are connected with other gate interconnects arranged in a line in the X direction, to constitute a word line WLP1. The gate interconnect 31 and the gate interconnect 33 are mutually connected through a bridge 35 formed between the gate interconnects 31 and 33. The gate interconnects 32 and 34 are connected with other gate interconnects arranged in a line in the X direction, to constitute a word line WLR1. The gate interconnect 32 and the gate interconnect 34 are mutually connected through a bridge 36 formed between the gate interconnects 32 and 34. The bridges 35 and 36 are an example of gate connections. Word lines WLP0 and WLR0 extending in the X direction are also formed in a similar manner Between the word lines WLR0 and WLR1, the drains are shared by the transistors TS adjacent to each other in the Y direction.

Local interconnects 41, 42, 43, 44, 45, and 46 extending in the X direction are formed. In FIG. 3, the local interconnects are abbreviated as LI. The local interconnect 41 is connected with the pad 21, the local interconnect 42 is connected with the pad 22, and the local interconnect 43 is connected with the pad 23. The local interconnect 44 is connected with the pad 24, the local interconnect 45 is connected with the pad 25, and the local interconnect 46 is connected with the pad 26. The local interconnect 43 is connected with the M1 interconnect 62 through a contact 51, and the local interconnect 46 is connected with the M1 interconnect 64 through a contact 52. The local interconnects 41, 42, and 43 have overlaps with the M1 interconnect 61 as viewed in plan, and the local interconnects 44, 45, and 46 have overlaps with the M1 interconnect 63 as viewed in plan.

Here, the memory cells MC5 and MC6 each include forksheet FETs as the transistors TP and TS. As shown in FIG. 4B, the faces of the nanosheets 12 on the side closer to the nanosheets 14 in the X direction are exposed from the gate interconnect 32, not covered with the gate interconnect 32. The faces of the nanosheets 14 on the side closer to the nanosheets 12 in the X direction are exposed from the gate interconnect 34, not covered with the gate interconnect 34. Similarly, the faces of the nanosheets 11 on the side closer to the nanosheets 13 in the X direction are exposed from the gate interconnect 31, not covered with the gate interconnect 31. The faces of the nanosheets 13 on the side closer to the nanosheets 11 in the X direction are exposed from the gate interconnect 33, not covered with the gate interconnect 33.

With the above configuration, since the space required between the nanosheets 11, 12 and the nanosheets 13, 14 is reduced, a distance d1 between the nanosheets 11, 12 and the nanosheets 13, 14 can be reduced (d1<d2). It is therefore possible to achieve reduction in the area of the semiconductor storage device having forksheet FETs.

As described above, in this embodiment, the semiconductor storage device includes the memory cells MC5 and MC6 adjacent to each other in the X direction. The memory cell MC5 includes nanosheet FETs, as the transistors TP and TS, having the nanosheets 11 and 12 as the channel regions. The memory cell MC6 includes nanosheet FETs, as the transistors TP and TS, having the nanosheets 13 and 14 as the channel regions. The nanosheets 11 and 13 are opposed to each other in the X direction, where the faces of the nanosheets 11 on the side closer to the nanosheets 13 in the X direction are exposed from the gate interconnect 31, and the faces of the nanosheets 13 on the side closer to the nanosheets 11 in the X direction are exposed from the gate interconnect 33. The nanosheets 12 and 14 are opposed to each other in the X direction, where the faces of the nanosheets 12 on the side closer to the nanosheets 14 in the X direction are exposed from the gate interconnect 32, and the faces of the nanosheets 14 on the side closer to the nanosheets 12 in the X direction are exposed from the gate interconnect 34. This can reduce the distance between the nanosheets 11, 12 and the nanosheets 13, 14, thereby permitting reduction in the area of the semiconductor storage device.

(Conversion to Mask ROM)

First Example

Figure 5:
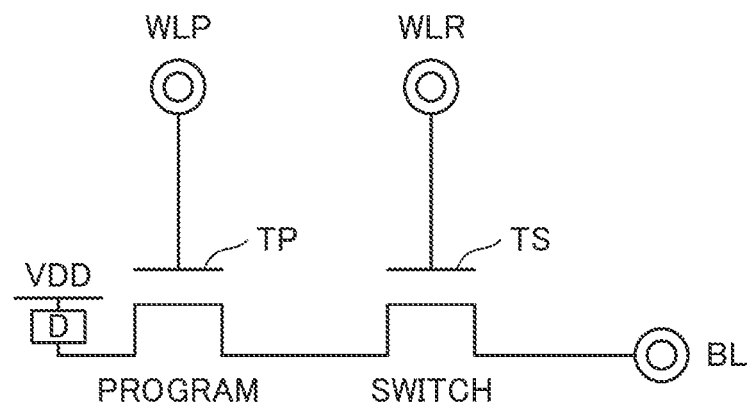
FIG. 5 is a circuit diagram of a mask ROM cell.

The above-described OTP memory cell can be easily converted to a mask ROM cell. FIG. 5 is a circuit diagram of a mask ROM cell converted from the OTP memory cell. In the OTP memory cell shown in FIG. 2, the storage value is prescribed depending on the presence or absence of breakdown of the gate oxide film of the transistor TP as the program element. On the contrary, in the mask ROM cell shown in FIG. 5, a prescribed value is stored depending on the presence or absence of connection between the source of the transistor TP and the power supply VDD (position "D" in FIG. 5). The presence or absence of connection is realized by the presence or absence of a contact or a via, for example.

The data read of the mask ROM cell shown in FIG. 5 is performed in the following manner. The bit line BL is precharged to a low level. In this state, a high level is applied to both the word lines WLP and WLR. When the source of the transistor TP is connected with the power supply VDD, the bit line BL changes to a high level. On the contrary, when the source of the transistor TP is not connected with the power supply VDD, the bit line BL remains low. From the difference in the potential of the bit line BL, the state of the mask ROM cell, i.e., a value "0" or "1" is read.

Figure 6:
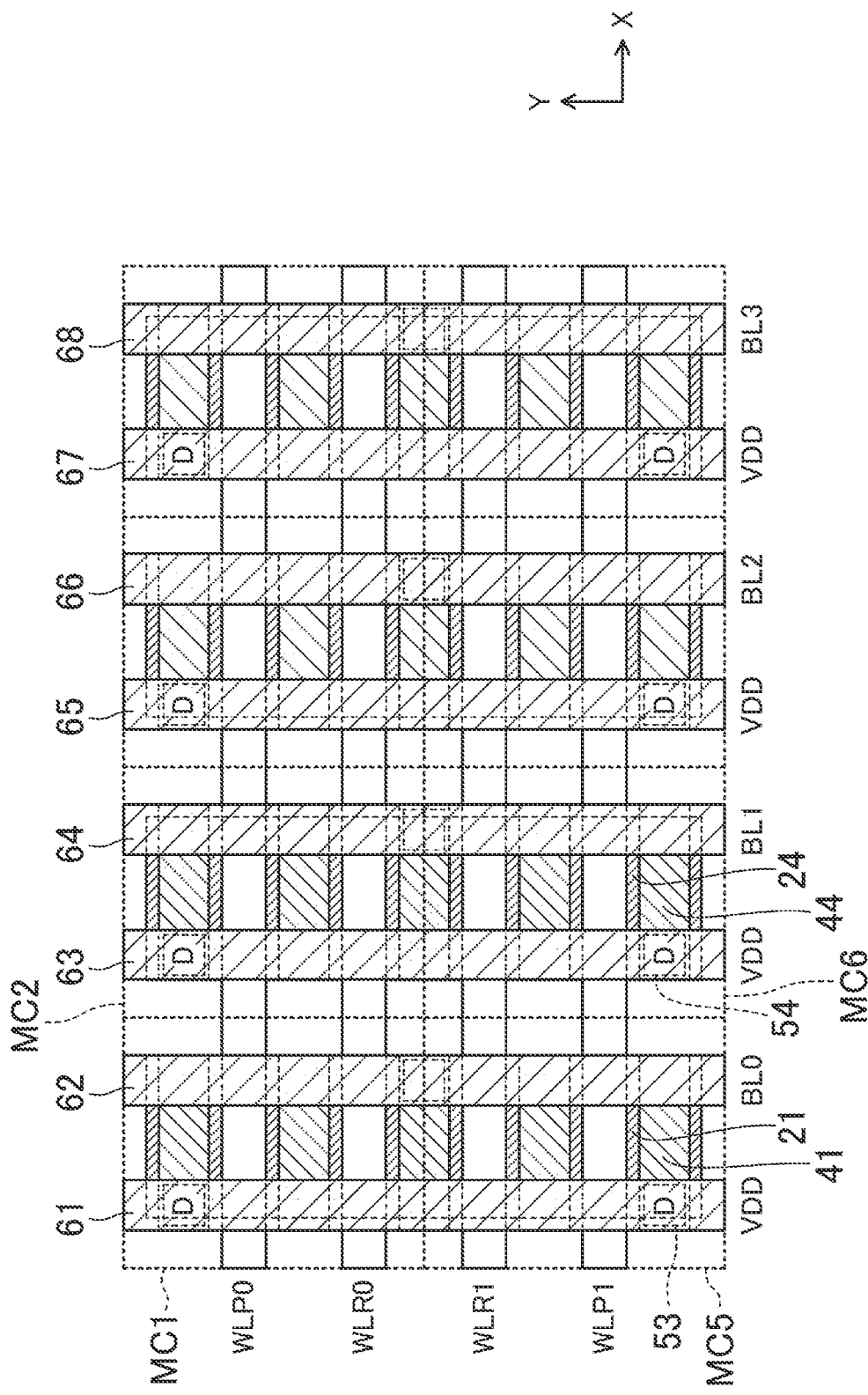
FIG. 6 is a plan view showing a layout structure example of the mask ROM cells of FIG. 5.

FIG. 6 is a plan view showing a layout structure example of the mask ROM cells converted from the OTP memory cells. The layout structure of FIG. 6 is basically the same as that of FIG. 3. In FIG. 6, the presence or absence of contacts 53 and 54 determines the storage values of the mask ROM cells MC5 and MC6. Note that in the figures illustrating mask ROM cells, contacts determining storage values are marked with the letter "D."

The contact 53 connects the local interconnect 41 and the M1 interconnect 61 when formed. That is, by the presence or absence of the contact 53, connection or disconnection between the pad 21, which is to be the source of the transistor TP of the mask ROM cell MC5, and the power supply VDD is set. The contact 54 connects the local interconnect 44 and the M1 interconnect 63 when formed. That is, by the presence or absence of the contact 54, connection or disconnection between the pad 24, which is to be the source of the transistor TP of the mask ROM cell MC6, and the power supply VDD is set.

Second Example

Figure 7:
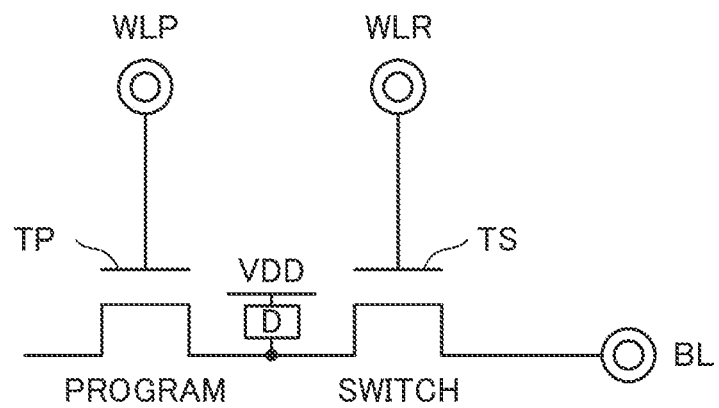
FIG. 7 is a circuit diagram of a mask ROM cell.

FIG. 7 is a circuit diagram showing another example of the mask ROM cell converted from the OTP memory cell. In the mask ROM cell shown in FIG. 7, a prescribed value is stored depending on the presence or absence of connection between the node, connecting the transistor TP and the transistor TS, and the power supply VDD.

Figure 8:
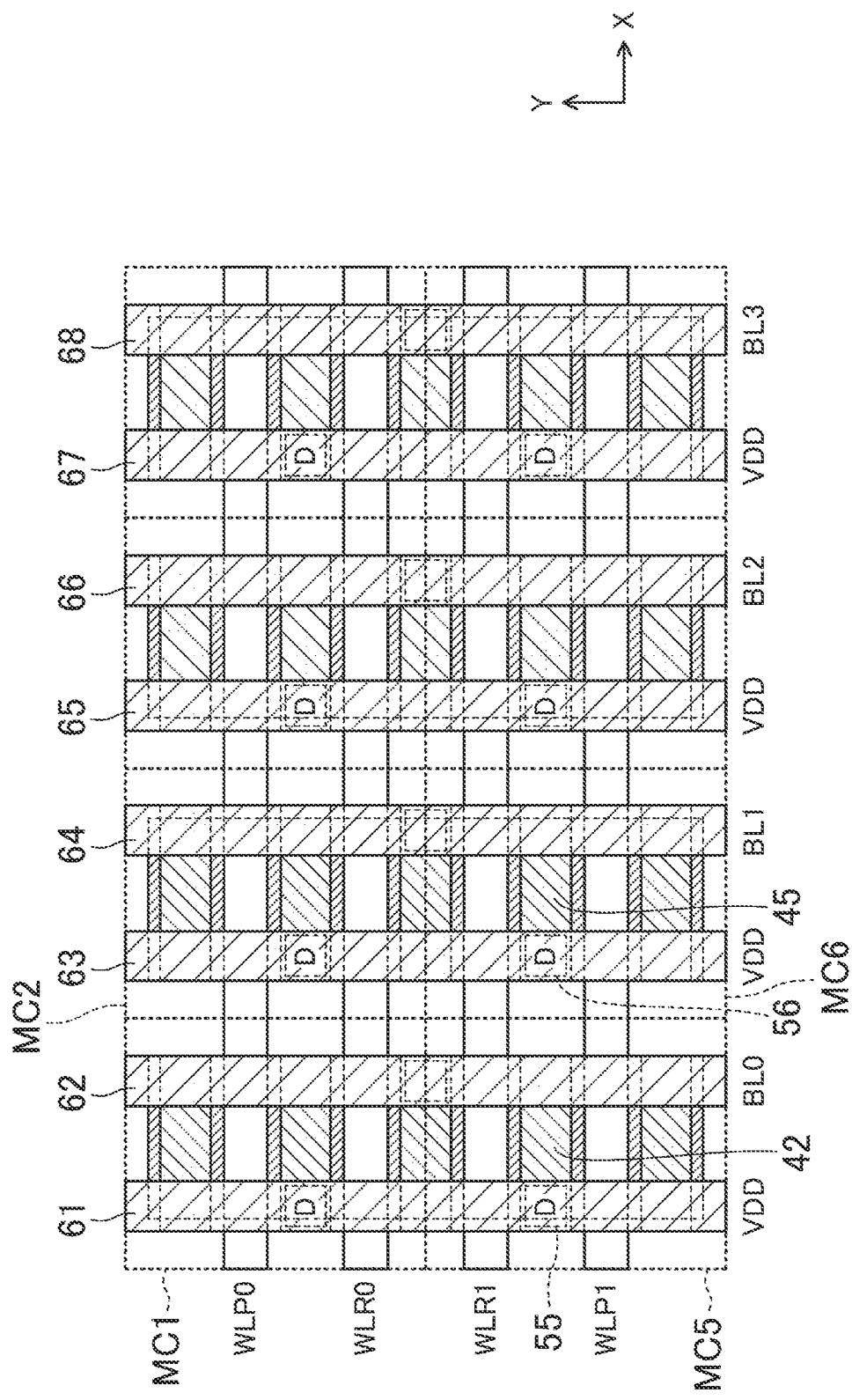
FIG. 8 is a plan view showing a layout structure example of the mask ROM cells of FIG. 7.

FIG. 8 is a plan view showing a layout structure example of the mask ROM cells converted from the OTP memory cells. The layout structure of FIG. 8 is basically the same as that of FIG. 3. As shown in FIG. 8, contacts 55 and 56 for determining the storage values of the mask ROM cells MC5 and MC6 are formed at positions on the local interconnects 42 and 45. That is, the contact 55 connects the local interconnect 42 and the M1 interconnect 61 when formed, and the contact 56 connects the local interconnect 45 and the M1 interconnect 63 when formed.

Note that, in the OTP memory cells in FIG. 3, the M1 interconnects supplying VDD (e.g., the M1 interconnects 61 and 63) and the local interconnects connected to the pads that are to be the nodes of the transistors TP (e.g., the local interconnects 41, 42, 44, and 45) are provided for facilitating conversion to mask ROM cells. When no consideration is given to such conversion to mask ROM cells, however, the M1 interconnects supplying VDD and the local interconnects connected to the pads that are to be the nodes of the transistors TP may be omitted.

Second Embodiment

Figure 9A:
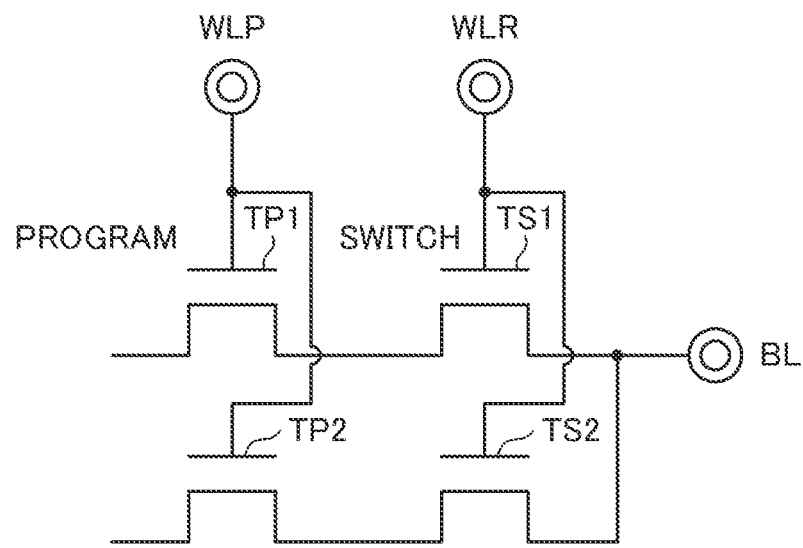
FIGS. 9A and 9B are circuit diagrams of memory cells according to the second embodiment, where
Figure 9B:
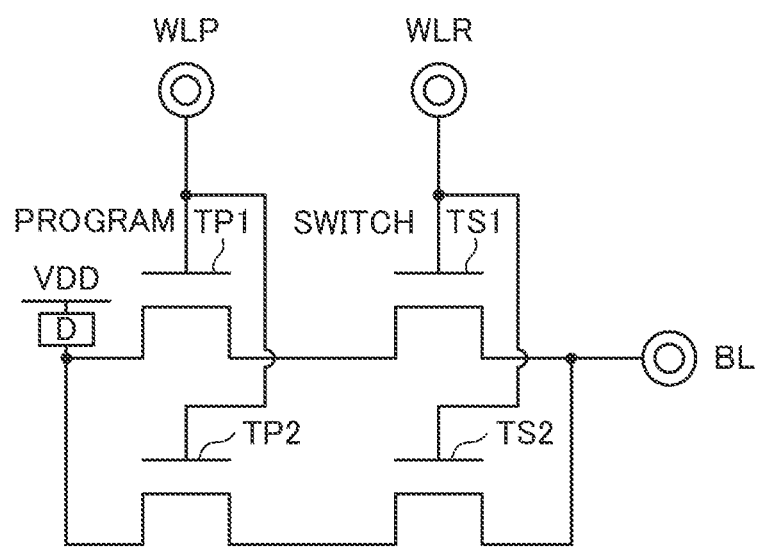

FIGS. 9A-9B are circuit diagrams of memory cells in a semiconductor storage device according to the second embodiment, where FIG. 9A shows an OTP memory cell and FIG. 9B shows a mask ROM cell converted from the OTP memory cell.

As is found from FIGS. 9A-9B, in this embodiment, the program element and the switch element are each constituted by two transistors. That is, the program element includes n-type transistors TP1 and TP2, and the switch element includes n-type transistors TS1 and TS2. The gates of the transistors TP1 and TP2 are connected to a first word line WLP, and the gates of the transistors TS1 and TS2 are connected to a second word line WLR.

The program element provided with two transistors TP1 and TP2 has the following merits. Even when data write, i.e., breakdown of the gate oxide film has not been sufficiently done in one transistor, the potential of the bit line BL can be changed by the other transistor, whereby stored data can be read correctly. Also, since the drive capability of the transistors is great compared with the case of the first embodiment, read operation can be performed at high speed.

Figure 10:
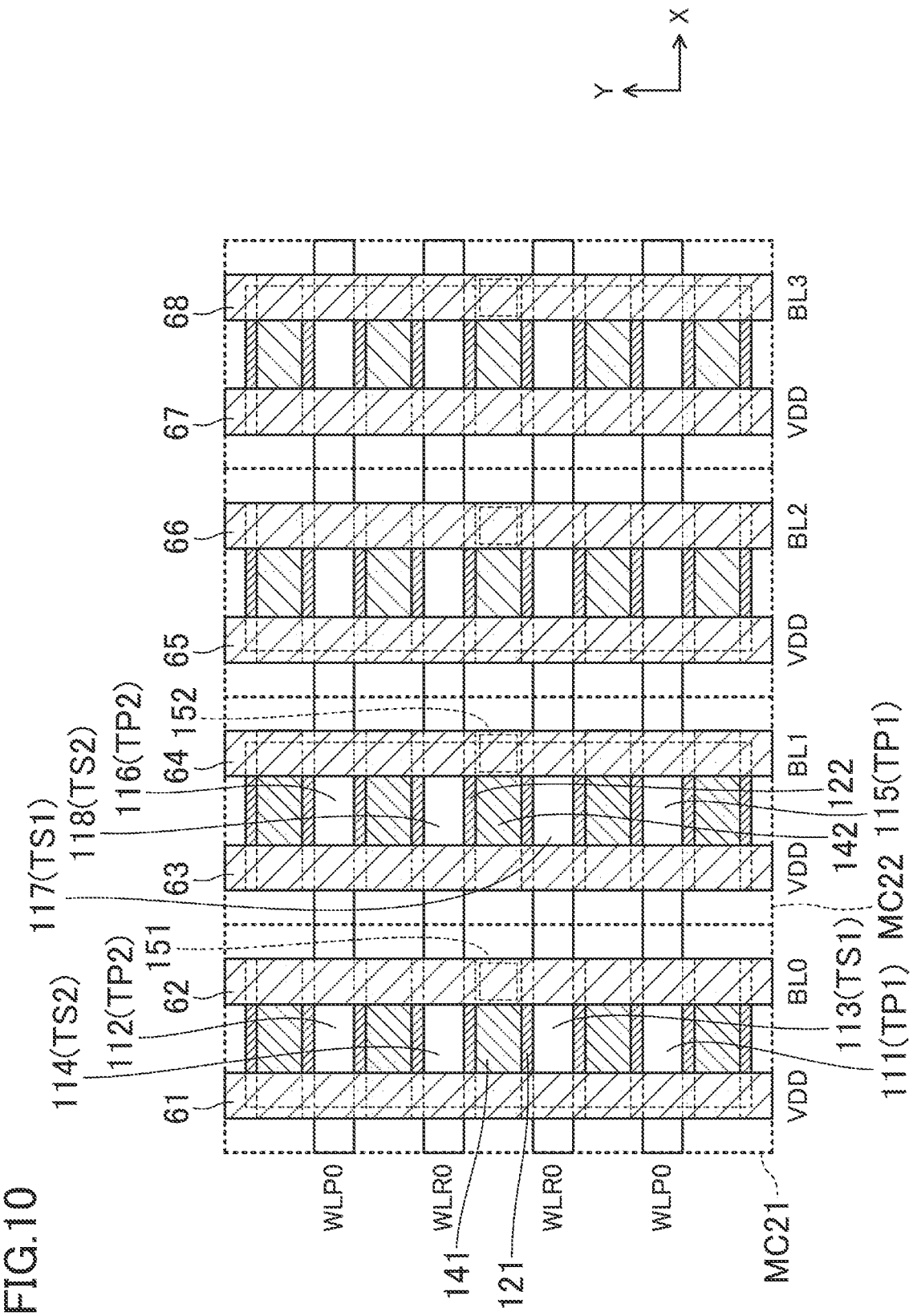
FIG. 10 is a plan view showing a layout structure example of memory cells according to the second embodiment.

FIG. 10 is a plan view showing a layout structure of memory cells according to this embodiment. The layout structure of FIG. 10 is basically the same as that of FIG. 3. However, two memory cells arranged side by side in the Y direction in FIG. 3 constitute a single memory cell. For example, the memory cells MC1 and MC5 in FIG. 3 constitute a single memory cell MC21 in FIG. 10, and the memory cells MC2 and MC6 in FIG. 3 constitute a single memory cell MC22 in FIG. 10. Also, in FIG. 10, the word lines WLP0 and WLP1 in FIG. 3 are both word lines WLP0 sharing a common signal, and the word lines WLR0 and WLR1 in FIG. 3 are both word lines WLR0 sharing a common signal.

Hereinafter, the structure of the memory cells will be described taking the memory cells MC21 and MC22 mainly as an example. Note that detailed description may be omitted here for a configuration that can be easily guessed from the layout structure of FIG. 3.

The memory cell MC21 has nanosheets 111 and 112, each composed of three sheets, as the channel portions of the transistors TP1 and TP2, respectively, and has nanosheets 113 and 114, each composed of three sheets, as the channel portions of the transistors TS1 and TS2, respectively. The memory cell MC22 has nanosheets 115 and 116, each composed of three sheets, as the channel portions of the transistors TP1 and TP2, respectively, and has nanosheets 117 and 118, each composed of three sheets, as the channel portions of the transistors TS1 and TS2, respectively.

In the memory cell MC21, a local interconnect 141 is connected to a pad 121 that is to be a common node of the transistors TS1 and TS2. The local interconnect 141 is connected with the M1 interconnect 62 corresponding to the bit line BL0 through a contact 151. In the memory cell MC22, a local interconnect 142 is connected to a pad 122 that is to be a common node of the transistors TS1 and TS2. The local interconnect 142 is connected with the M1 interconnect 64 corresponding to the bit line BL1 through a contact 152.

Here, the memory cells MC21 and MC22 each include forksheet FETs as the transistors TP1, TP2, TS1, and TS2. The faces of the nanosheets 111 on the side closer to the nanosheets 115 in the X direction are exposed from the corresponding gate interconnect, not covered with the gate interconnect, and the faces of the nanosheets 115 on the side closer to the nanosheets 111 in the X direction are exposed from the corresponding gate interconnect, not covered with the gate interconnect. Similarly, the faces of the nanosheets 112 on the side closer to the nanosheets 116 in the X direction are exposed from the corresponding gate interconnect, not covered with the gate interconnect, and the faces of the nanosheets 116 on the side closer to the nanosheets 112 in the X direction are exposed from the corresponding gate interconnect, not covered with the gate interconnect. The faces of the nanosheets 113 on the side closer to the nanosheets 117 in the X direction are exposed from the corresponding gate interconnect, not covered with the gate interconnect, and the faces of the nanosheets 117 on the side closer to the nanosheets 113 in the X direction are exposed from the corresponding gate interconnect, not covered with the gate interconnect. The faces of the nanosheets 114 on the side closer to the nanosheets 118 in the X direction are exposed from the corresponding gate interconnect, not covered with the gate interconnect, and the faces of the nanosheets 118 on the side closer to the nanosheets 114 in the X direction are exposed from the corresponding gate interconnect, not covered with the gate interconnect.

According to this embodiment, as in the first embodiment, since the space required between the nanosheets 111, 112, 113, 114 and the nanosheets 115, 116, 117, 118 is reduced, the distance between the nanosheets 111, 112, 113, 114 and the nanosheets 115, 116, 117, 118 can be reduced. It is therefore possible to achieve reduction in the area of the semiconductor storage device having forksheet FETs.

In addition, in the memory cells shown in FIG. 10, the program element has two transistors TP1 and TP2, and the switch element has two transistors TS1 and TS2. Therefore, even when data write, i.e., breakdown of the gate oxide film has not been sufficiently done in one transistor, the signal of the bit line BL can be changed by the other transistor, whereby stored data can be read correctly. Also, read operation can be sped up.

Figure 11:
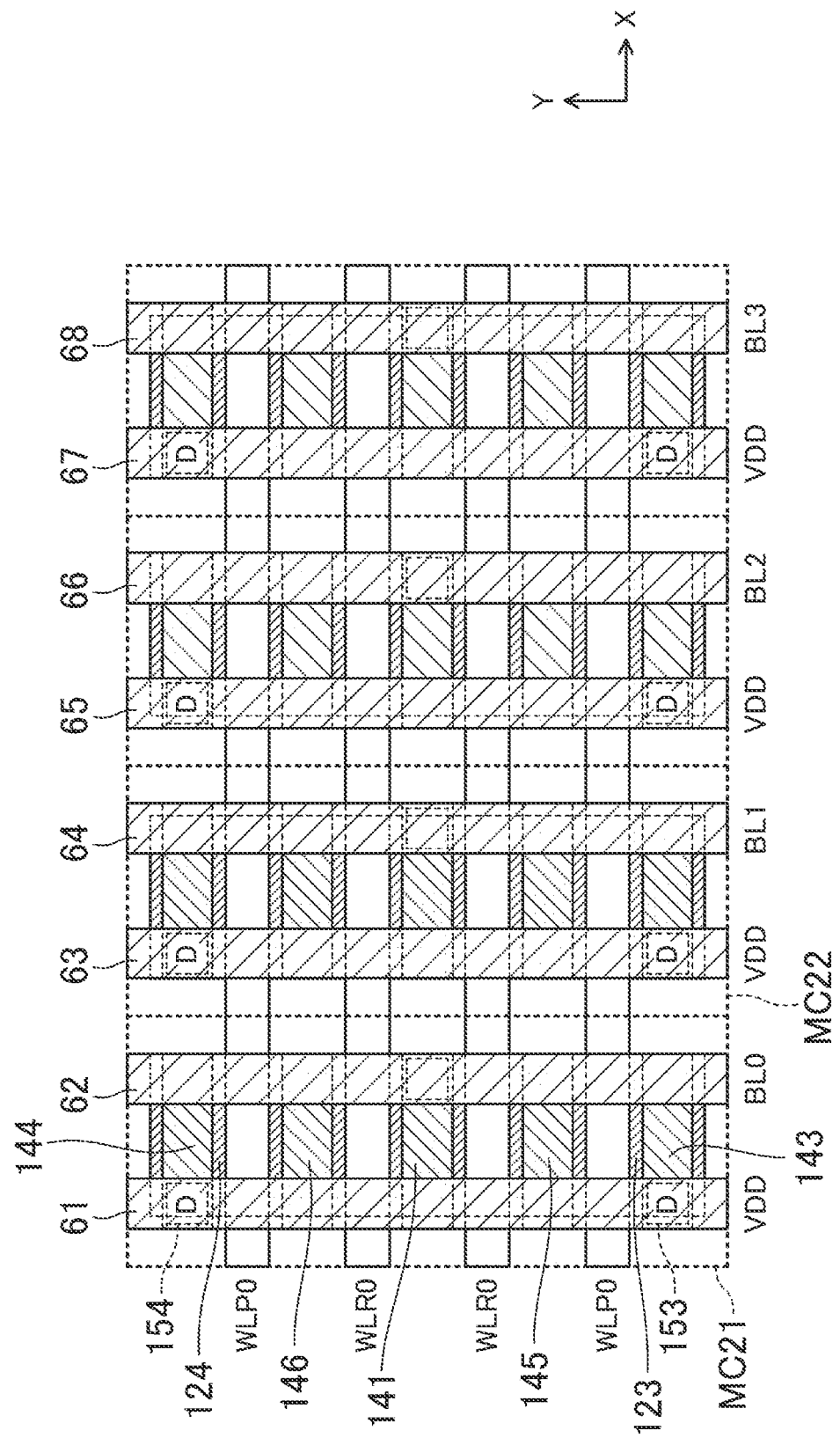
FIG. 11 is a plan view showing a layout structure example of mask ROM cells.

FIG. 11 is a plan view showing a layout structure example of mask ROM cells converted from the OTP memory cells. The layout structure of FIG. 11 is basically the same as that of FIG. 10. In FIG. 11, the presence or absence of contacts 153 and 154 determines the storage value of the memory cell MC21. Local interconnects 143, 144, 145, and 146 have overlaps with the M1 interconnect 61 as viewed in plan. The contact 153 connects the local interconnect 143, connected to a pad 123 that is to be a node of the transistor TP1, and the M1 interconnect 61 when formed. The contact 154 connects the local interconnect 144, connected to a pad 124 that is to be a node of the transistor TP2, and the M1 interconnect 61 when formed. That is, by the presence or absence of the contacts 153 and 154, connection or disconnection between the sources of the transistors TP1 and TP2 of the memory cell MC21 and the power supply VDD is set.

As in the second example of the first embodiment, the contacts for determining the storage value of the memory cell MC21 may be formed at positions on the local interconnects 145 and 146. In this case, the contacts will connect the local interconnects 145 and 146 connected to pads that are to be nodes of the transistors TP1 and TP2, with the M1 interconnect 61 when formed.

Note that, in the OTP memory cells in FIG. 10, the M1 interconnects supplying VDD (e.g., the M1 interconnects 61 and 63) and the local interconnects connected to the pads that are to be the nodes of the transistors TP1 and TP2 (e.g., the local interconnects 143, 144, 145, and 146) are provided for facilitating conversion to mask ROM cells. When no consideration is given to such conversion to mask ROM cells, however, the M1 interconnects supplying VDD and the local interconnects connected to the pads that are to be the nodes of the transistors TP1 and TP2 may be omitted.

Also, in the above embodiments, the M1 interconnects 61 to 68 extending in the Y direction are arranged at equal spacing, and the M1 interconnects 62, 64, 66, and 68 corresponding to the bit lines BL0 to BL3 are individually interposed between the M1 interconnects 61, 63, 65, and 67 supplying VDD. With the bit lines BL each interposed between VDD lines, crosstalk between the bit lines BL can be prevented, whereby occurrence of a malfunction can be prevented or reduced. Moreover, since the distances from a bit line BL to its adjacent VDD lines on both sides are the same among all the bit lines BL, the load capacitance caused by wiring capacitance for the bit line BL is uniform. This prevents or reduces variations in performance, such as the operating speed, among the bit lines BL.

It is not necessarily required to arrange the M1 interconnects 61 to 68 extending in the Y direction at equal spacing. In such a case, also, if only the distances from a bit line BL to its adjacent VDD lines on both sides are the same among all the bit lines BL, the load capacitance caused by wiring capacitance for the bit line BL will be uniform, and thus variations in performance, such as the operating speed, among the bit lines BL will be prevented or reduced. For example, even when all of the M1 interconnects 61, 63, 65, and 67 supplying VDD are displaced by a same distance in the X direction, the load capacitance caused by wiring capacitance for each bit line BL will be uniform, and thus variations in performance, such as the operating speed, among the bit lines BL will be prevented or reduced.

While each channel portion has a stacked structure of three nanosheets in the above embodiments, it is not limited to this. Some or all of the channel portions may include one nanosheet, or a stacked structure of two, four, or more nanosheets.

Also, while the cross-sectional shape of the nanosheets is illustrated as rectangular in the above embodiments, it is not limited to this. For example, the shape may be square, circular, or oval.

According to the present disclosure, a small-area layout structure can be implemented for a semiconductor integrated circuit device provided with memory cells using forksheet FETs. The present disclosure is therefore useful for improvement of the performance of a semiconductor chip, for example.

What is claimed is:

1. A semiconductor storage device including first and second memory cells adjacent to each other in a first direction, the first and second memory cells being nonvolatile, comprising:
   first and second word lines extending in the first direction; and
   first and second bit lines extending in a second direction perpendicular to the first direction,
   wherein
   the first memory cell includes
      a first program transistor with a gate connected to the first word line, and
      a first switch transistor, provided between the first program transistor and the first bit line, with a gate connected to the second word line,
   the second memory cell includes
      a second program transistor with a gate connected to the first word line, and
      a second switch transistor, provided between the second program transistor and the second bit line, with a gate connected to the second word line,
   the first and second program transistors are nanosheet field effect transistors (FETs) having first and second nanosheets, respectively, as channel regions,
   the first and second switch transistors are nanosheet FETs having third and fourth nanosheets, respectively, as channel regions,
   the first word line includes a first gate interconnect surrounding peripheries of the first nanosheet in the first direction and a third direction perpendicular to the first and second directions and a second gate interconnect surrounding peripheries of the second nanosheet in the first direction and the third direction,
   the second word line includes a third gate interconnect surrounding peripheries of the third nanosheet in the first direction and the third direction and a fourth gate interconnect surrounding peripheries of the fourth nanosheet in the first direction and the third direction,
   the first and second nanosheets are opposed to each other in the first direction, a face of the first nanosheet on a side closer to the second nanosheet in the first direction is exposed from the first gate interconnect, and a face of the second nanosheet on a side closer to the first nanosheet in the first direction is exposed from the second gate interconnect, and
   the third and fourth nanosheets are opposed to each other in the first direction, a face of the third nanosheet on a side closer to the fourth nanosheet in the first direction is exposed from the third gate interconnect, and a face of the fourth nanosheet on a side closer to the third nanosheet in the first direction is exposed from the fourth gate interconnect.

2. The semiconductor storage device of claim 1, further comprising:
a third memory cell adjacent to the first memory cell in the second direction; and
third and fourth word lines extending in the first direction, wherein
the third memory cell includes
a third program transistor with a gate connected to the fourth word line, and
a third switch transistor, provided between the third program transistor and the first bit line, with a gate connected to the third word line, and
the third program transistor and the third switch transistor are nanosheet FETs each having a nanosheet as a channel region.

3. The semiconductor storage device of claim 1, further comprising
third and fourth word lines extending in the first direction, wherein
the first memory cell includes
a third program transistor with a gate connected to the fourth word line, and
a third switch transistor, provided between the third program transistor and the first bit line, with a gate connected to the third word line,
the third program transistor and the third switch transistor are nanosheet FETs each having a nanosheet as a channel region,
a common first word line signal is supplied to the first and fourth word lines, and
a common second word line signal is supplied to the second and third word lines.

4. The semiconductor storage device of claim 1, further comprising
first and second power supply lines extending in the second direction,
wherein
the first memory cell includes
a first local interconnect that is connected to one node of the first program transistor and has an overlap with the first power supply line as viewed in plan, and
the second memory cell includes
a second local interconnect that is connected to one node of the second program transistor and has an overlap with the second power supply line as viewed in plan.

5. The semiconductor storage device of claim 4, wherein the first and second bit lines, and the first and second power supply lines, are arranged at equal spacing in the first direction.

6. The semiconductor storage device of claim 1, wherein the first word line includes a first gate connection formed between the first gate interconnect and the second gate interconnect for connecting the first gate interconnect and the second gate interconnect, and
the second word line includes a second gate connection formed between the third gate interconnect and the fourth gate interconnect for connecting the third gate interconnect and the fourth gate interconnect.

* * * * *